United States Patent
Bayn et al.

(10) Patent No.: US 10,985,524 B1
(45) Date of Patent: Apr. 20, 2021

(54) HIGH-POWER HYBRID SILICON-PHOTONICS LASER

(71) Applicant: APPLE INC., Cupertino, CA (US)

(72) Inventors: Igal I. Bayn, Sunnyvale, CA (US); Andrew J. Sutton, Sunnyvale, CA (US); Alexander Shpunt, Portola Valley, CA (US); Yuval Gerson, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 84 days.

(21) Appl. No.: 16/527,127

(22) Filed: Jul. 31, 2019

Related U.S. Application Data

(60) Provisional application No. 62/724,043, filed on Aug. 29, 2018.

(51) Int. Cl.
| | | |
|---|---|---|
| *H01S 5/02* | (2006.01) | |
| *H01S 5/343* | (2006.01) | |
| *H01S 5/042* | (2006.01) | |
| *G02F 1/025* | (2006.01) | |
| *H01S 5/022* | (2021.01) | |
| *H01S 5/024* | (2006.01) | |
| *H01S 5/14* | (2006.01) | |

(Continued)

(52) U.S. Cl.
CPC ............ *H01S 5/0218* (2013.01); *G02F 1/025* (2013.01); *H01S 5/021* (2013.01); *H01S 5/02228* (2013.01); *H01S 5/02461* (2013.01); *H01S 5/042* (2013.01); *H01S 5/34306* (2013.01); *G02F 2001/0152* (2013.01); *G02F 2001/0156* (2013.01); *G02F 2201/063* (2013.01); *G02F 2201/346* (2013.01); *G02F 2202/102* (2013.01); *H01S 5/125* (2013.01); *H01S 5/14* (2013.01)

(58) Field of Classification Search
CPC .. H01S 5/021; H01S 5/02228; H01S 5/02461; H01S 5/042; H01S 5/34306; H01S 5/125; H01S 5/14; G02F 2001/0152; G02F 2001/0156; G02F 2201/063; G02F 2201/346; G02F 2202/102
See application file for complete search history.

(56) References Cited

U.S. PATENT DOCUMENTS

| | | |
|---|---|---|
| 5,513,196 A | 4/1996 | Bischel et al. |
| 8,168,939 B2 | 5/2012 | Mack et al. |
| 2012/0280344 A1 | 11/2012 | Shastri et al. |

(Continued)

FOREIGN PATENT DOCUMENTS

| | | |
|---|---|---|
| GB | 2391952 A | 2/2004 |

OTHER PUBLICATIONS

Merritt., "DesignCon: Cisco packs silicon photonics on 3-D ICs", EDN Network, pp. 1-2, Jan. 28, 2013.

(Continued)

*Primary Examiner* — Armando Rodriguez
(74) *Attorney, Agent, or Firm* — Kligler & Associates Patent Attorneys Ltd

(57) ABSTRACT

An optoelectronic device includes a silicon substrate, with a silicon waveguide layer disposed over the silicon substrate and including an optical waveguide. One or more through-silicon vias (TSVs) extend through the silicon substrate and contact the silicon waveguide layer. A III-V base layer is disposed over the silicon waveguide layer, and an optical amplifier is disposed on the III-V base layer and optically coupled to the optical waveguide.

20 Claims, 4 Drawing Sheets

(51) Int. Cl.
*H01S 5/125* (2006.01)
*G02F 1/015* (2006.01)

(56) References Cited

U.S. PATENT DOCUMENTS

| | | |
|---|---|---|
| 2013/0154759 A1 | 6/2013 | Morita et al. |
| 2014/0010509 A1 | 1/2014 | Zayets et al. |
| 2015/0185426 A1 | 7/2015 | Miao et al. |
| 2016/0126696 A1 | 5/2016 | Gudeman |
| 2016/0195737 A1 | 7/2016 | Nakamura |
| 2017/0237516 A1 | 8/2017 | Welch |
| 2017/0269395 A1 | 9/2017 | Heck et al. |
| 2019/0324203 A1 | 10/2019 | Bayn et al. |
| 2020/0049906 A1* | 2/2020 | Budd .................. G02B 6/43 |

OTHER PUBLICATIONS

Peter De Dobbelaere-Luxtera., "Light source approach for silicon photonics transceivers", pp. 1-12, Sep. 30, 2014.
Deltronic Crystal Industries, Inc., "Free-Space Optical Isolator and Faraday Rotator Product Line", pp. 1-4, year 2012.
Sysak et al., "Hybrid Silicon Laser Technology: A Thermal Perspective", IEEE Journal of Selected Topics in Quantum Electronics, vol. 17, No. 6, pp. 1490-1498, Nov./Dec. 2011.
U.S. Appl. No. 16/271,833 office action dated Oct. 3, 2019.
Duan et al., "Hybrid III-V Silicon Photonic Integrated Circuits for Optical Communication Applications", IEEE Journal of Selected Topics in Quantum Electronics, vol. 22, No. 6, pp. 1-11, Nov./Dec. 2016.
Duan et al., "New Advances on Heterogeneous Integration of III-V on Silicon", Journal of Lightwave Technology, vol. 33, No. 5, pp. 976-983, Mar. 1, 2015.
Duan et al., "Hybrid III-V on Silicon Lasers for Photonic Integrated Circuits on Silicon", IEEE Journal of Selected Topics in Quantum Electronics, vol. 20, No. 4, pp. 1-13, Jul./Aug. 2014.

\* cited by examiner

HIGH-POWER HYBRID SILICON-PHOTONICS LASER

CROSS-REFERENCE TO RELATED APPLICATION

This application claims the benefit of U.S. Provisional Patent Application 62/724,043, filed Aug. 29, 2018, which is incorporated herein by reference.

FIELD OF THE INVENTION

The present invention relates generally to optoelectronic devices, and particularly to integrated photonic devices and methods for their fabrication.

BACKGROUND

Photonic integrated circuits (PICs) integrate multiple optical and optoelectronic functions in a single device, fabricated on a semiconductor substrate. These functions include both passive routing elements, such as waveguides, splitters, couplers and resonators; and active elements, such as tuners, modulators and detectors, as well as lasers. Some PICs incorporating lasers that are currently known in the art are fully implemented on a III-V substrate, resulting in low-yield and high cost. Other PICs are made on silicon substrates using CMOS-compatible processes and are then integrated with a separately-fabricated laser (III-V) and other components, usually on an optical interposer. This latter approach allows utilization of the large-scale production, low cost and high yield that Si-photonics inherit from CMOS processing, but suffers from difficult, costly assembly based on "pick and place" tools.

Recently, a number of foundries have developed the capability of integrating III-V laser dies on SOI (silicon on insulator) wafers, together with silicon-based waveguides and other optical and electro-optical components. One of the techniques that has been developed for this purpose is hybrid integration, in which an unprocessed III-V wafer is bonded to a silicon wafer that has been patterned with optical waveguides. Multiple III-V hybrid lasers are then fabricated simultaneously across the wafer by epitaxial deposition on the III-V wafer and standard fabrication techniques. Because the silicon waveguides are patterned before laser fabrication, the lasers are precisely aligned with the waveguides, without requiring fine alignment between the unpatterned III-V wafer and the patterned silicon wafer.

SUMMARY

Embodiments of the present invention that are described hereinbelow provide improved integrated photonic devices and methods for producing such devices.

There is therefore provided, in accordance with an embodiment of the invention, an optoelectronic device, including a silicon substrate, with a silicon waveguide layer disposed over the silicon substrate and including an optical waveguide. One or more through-silicon vias (TSVs) extend through the silicon substrate and contact the silicon waveguide layer. A III-V base layer is disposed over the silicon waveguide layer, and an optical amplifier is disposed on the III-V base layer and optically coupled to the optical waveguide.

In some embodiments, the one or more TSVs include first and second TSVs, which contact the silicon waveguide layer on opposing first and second sides of the optical waveguide.

In a disclosed embodiment, the device includes a bias generator, which is coupled to apply a bias voltage between the first and second TSVs. In one such embodiment, the silicon waveguide layer includes a p-doped region in contact with the first TSV and an n-doped region in contact with the second TSV, while the optical waveguide includes intrinsic silicon, thereby defining a p-i-n diode structure in the silicon waveguide. The bias generator may be configured to reverse-bias the p-i-n diode structure, thereby sweeping free carriers out of the optical waveguide.

Additionally or alternatively, the bias generator is configured to modulate the bias voltage so as to control at least one operating parameter of the device, selected from a group of operating parameters consisting of a coefficient of absorption and an effective index of refraction of the optical waveguide.

In a disclosed embodiment, the optical waveguide includes a ridge on the silicon waveguide layer in proximity to the optical amplifier. Additionally or alternatively, the optical waveguide includes a double-slit waveguide.

In some embodiments, the device includes a dielectric layer between the silicon waveguide layer and the III-V substrate. In one embodiment, a dielectric encapsulation structure encapsulates the optical amplifier and includes the dielectric layer between the silicon waveguide layer and the III-V substrate.

In a disclosed embodiment, the III-V base layer and the optical amplifier include InP. Additionally or alternatively, the optical amplifier includes multiple epitaxial layers formed on the III-V base layer.

There is also provided, in accordance with an embodiment of the invention, a method for fabricating an optoelectronic device, which includes forming an optical waveguide in a silicon waveguide layer disposed on a silicon substrate. One or more through-silicon vias (TSVs) are formed in the silicon substrate so that the one or more TSVs extend through the silicon substrate and contact the silicon waveguide layer. A III-V base layer is bonded to the silicon waveguide layer. An optical amplifier is formed on the III-V base layer so that the optical amplifier is optically coupled to the optical waveguide.

The present invention will be more fully understood from the following detailed description of the embodiments thereof, taken together with the drawings in which:

DETAILED DESCRIPTION OF EMBODIMENTS

Although the power output of available III-V semiconductor lasers, such as InP-based lasers, has increased in recent years, similar improvements in hybrid, silicon-based lasers have been held back by a number of physical limitations. In comparison to the III-V substrate of the laser, which is a good heat conductor, the glass (SiO2) bonding and encapsulation layers below and surrounding the III-V optical amplifier have much lower thermal conductivity. At the same time, the efficiency of the III-V optical amplifier decreases sharply with increasing temperature. There is therefore a need for improved heat dissipation schemes in order to increase the efficiency and output power of hybrid III-V/silicon lasers.

Laser efficiency at high power is also degraded by non-linear absorption mechanisms in the silicon waveguide. As optical intensity in the waveguide increases, two-photon absorption by the silicon becomes significant, particularly at longer wavelengths, such as in the InP C-band laser at 1.55 µm. The two-photon absorption gives rise to free carriers in the silicon waveguide, which themselves absorb additional laser energy by free carrier absorption, leading to losses that increase in severity as carrier density increases. Although two-photon absorption is an inherent physical property of the silicon, free carrier absorption can be mitigated by removal of the free carriers from the silicon waveguide region. There is thus a need to modify hybrid laser designs in order to enable rapid removal of free carriers from the waveguide.

Embodiments of the present invention that are described herein address both of these needs through the use of through-silicon vias (TSVs). (A TSV is a vertical electrical connection, commonly known as a "via," that passes completely through a silicon wafer or die.) In the disclosed embodiments, one or more TSVs extend through the silicon substrate of a hybrid laser to contact the silicon waveguide layer, which is in close proximity to the bonded III-V substrate. Due to the high thermal conductivity of the TSV metal fill materials, the TSVs efficiently sink heat through the silicon substrate and away from the III-V optical amplifier, thus reducing its operating temperature.

Furthermore, by applying a bias voltage between a pair of TSVs that contact the silicon waveguide layer on opposing sides of the waveguide, free carriers can be swept out of the waveguide region, thus decreasing free carrier absorption. For this purpose, it is useful to configure the waveguide layer as a p-i-n diode, for example by a suitable doping process. The p-region is on one side of the waveguide and the n-region on the other, while the waveguide itself is intrinsic silicon. The TSVs are driven to reverse-bias the p-i-n diode, thus sweeping the free carriers rapidly out of the waveguide region.

Figure 1A:
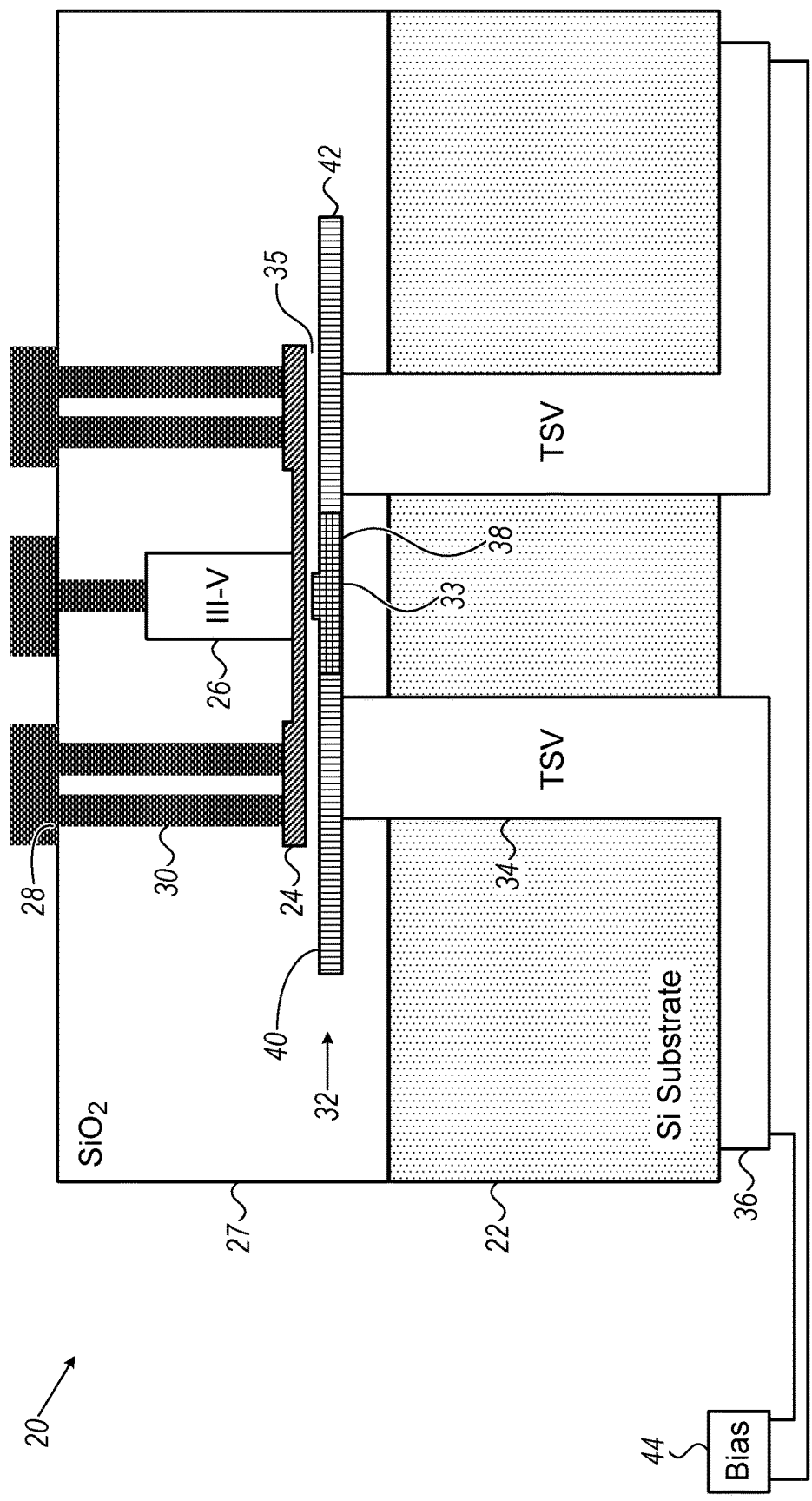
FIGS. 1A and 1B are schematic frontal and side sectional views, respectively, of an optoelectronic device, in accordance with an embodiment of the invention.
Figure 1B:
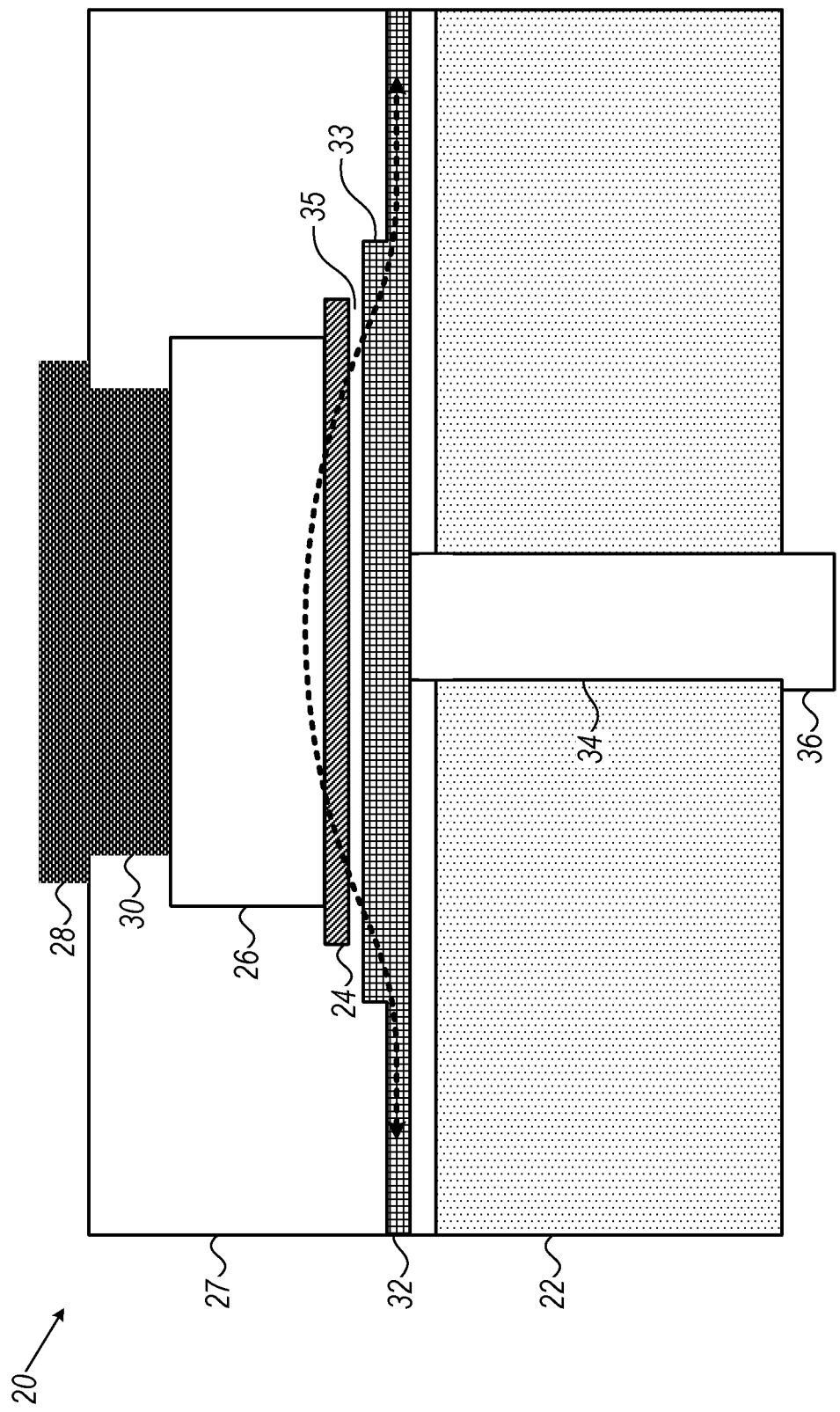

Reference is now made to FIGS. 1A and 1B, which are schematic frontal and side sectional views, respectively, of an optoelectronic device 20, in accordance with an embodiment of the invention. Device 20 is configured to operate as a hybrid laser, and comprises an optical amplifier 26 on a III-V base layer 24, for example an InP base layer, bonded to a silicon substrate 22 using fabrication processes that are known in the art.

An optical amplifier 26, comprising multiple epitaxial layers, is formed on III-V base layer 24 by processes of epitaxial growth and photolithography, as are likewise known in the art. (The internal structure of the optical amplifier is omitted from FIGS. 1A/B for the sake of simplicity.) For example, optical amplifier 26 may comprise an n-type InP laser at the upper surface of base layer 24, overlaid by an optical amplification layer comprising multiple quantum wells, which is in turn overlaid by p-type InP. Optical amplifier 26 and base layer 24 are encapsulated in a dielectric encapsulation structure 27, comprising multiple layers of SiO2, for example. Electrical contacts 28 at the upper side of dielectric structure 27 connect to the n- and p-InP layers through vias 30 in order to provide a pump current to amplifier 26, in either pulsed or continuous mode.

Before bonding of III-V base layer 24, a silicon waveguide layer 32 is formed over silicon substrate 22, typically with a dielectric layer (such as SiO2) between substrate 22 and waveguide layer 32, as shown in the figures. An optical waveguide, for example, a ridge waveguide 33, is formed on waveguide layer 32. A thin dielectric layer 35 (also SiO2, for example) is then deposited over waveguide layer 32, and III-V base layer 24 is bonded to this dielectric layer. In a typical implementation, waveguide 33 is about 1 µm wide and protrudes about 0.25 µm above waveguide layer 32. The thickness of dielectric layer 35 over waveguide 33 is about 100 nm, while the thickness of the III-V layers between dielectric layer 35 and the optical amplification layer is about 140 nm. The center-to-center distance between the optical amplification layer and waveguide 33 is about 1.5 µm, meaning that the optical modes in optical amplifier 26 at near-infrared wavelengths are strongly coupled into waveguide 33, as illustrated by the dashed arrow in FIG. 1B.

The specific configuration of device 20 in FIGS. 1A/B and the dimensions listed above are presented here solely by way of example, and the principles of the present invention are similarly applicable in other sorts of hybrid device configurations. In the pictured embodiment, waveguide layer 32 may include reflective structures, such as distributed Bragg reflectors (not shown in the figures), and may thus serve as an external cavity for a laser in which optical amplifier 26 serves as the gain medium. Alternatively, optical amplifier 26 may provide single-pass amplification of an optical signal carried in waveguide 33. As another alternative, the end-facets of waveguide 33 may be formed by cleavage or deep etching and coated for sufficient reflectivity so that the optical amplifier functions as a laser.

As explained earlier, the configuration of semiconductor and dielectric layers described above is capable of generating high optical output power (in excess of 100 mW), but at the same time must dissipate an even greater amount of heat. To facilitate heat removal, and thus reduce the temperature of optical amplifier 26, TSVs 34 are formed through silicon substrate 22. TSVs 34 are etched all the way through substrate 22 and are then filled with a suitable metal, such as copper or aluminum. The upper ends of TSVs 34 protrude above the upper side of substrate 22 through the overlying dielectric layer, and thus make electrical and thermal contact with silicon waveguide layer 32. The lower ends of TSVs pass completely through to the opposing, lower side of the silicon substrate, where they make electrical and thermal contact with conductive pads 36. For good thermal conduction, it is desirable that TSVs 34 be relatively thick, for example about 20 µm in diameter or 20×20 µm square.

Device 20 is shown in FIG. 1A as comprising two TSVs 34, on opposing sides of waveguide 33. This configuration is advantageous both for purposes of electrical biasing of waveguide layer 32, as described below, and for enhancing heat removal. To reduce optical losses from waveguide 33, TSVs 34 should not be located directly under the waveguide, but rather spaced apart to either side, as shown in the figure. For example, as long as the inner edges of TSVs 34 are each displaced by at least 1.5 µm from the centerline of waveguide 33, the resulting optical losses in the InP C-band will be less than about 0.1 dB/cm. Alternatively, for purposes of heat removal, a single TSV or three or more TSVs may be used, with different sizes and/or shapes depending upon application requirements.

As explained above, two-photon absorption of the intense laser radiation within waveguide 33 gives rise to free carriers in the waveguide, which in turn absorb further laser radiation by free carrier absorption. To reduce these latter losses, a bias generator 44 applies a bias voltage between contact pads 36 of TSVs 34 in order to sweep the free carriers out of waveguide layer 32.

For the sake of effective removal of free carriers from waveguide 33, it is advantageous that silicon waveguide layer 32 be configured as a p-i-n diode, and the voltage applied by bias generator 44 is set so as to reverse-bias this p-i-n diode structure. For this purpose, the part of waveguide layer 32 to one side of waveguide 33 is configured, for example by ion implantation, as an n-doped region 40, while the part of waveguide layer 32 on the other side of waveguide 33 is configured as a p-doped region 42. A central region 38 of waveguide layer 32, including waveguide 33, remains as an intrinsic silicon region. Reverse-biasing this p-i-n diode structure causes free carriers to be conducted rapidly out of waveguide layer 32.

Figure 2:
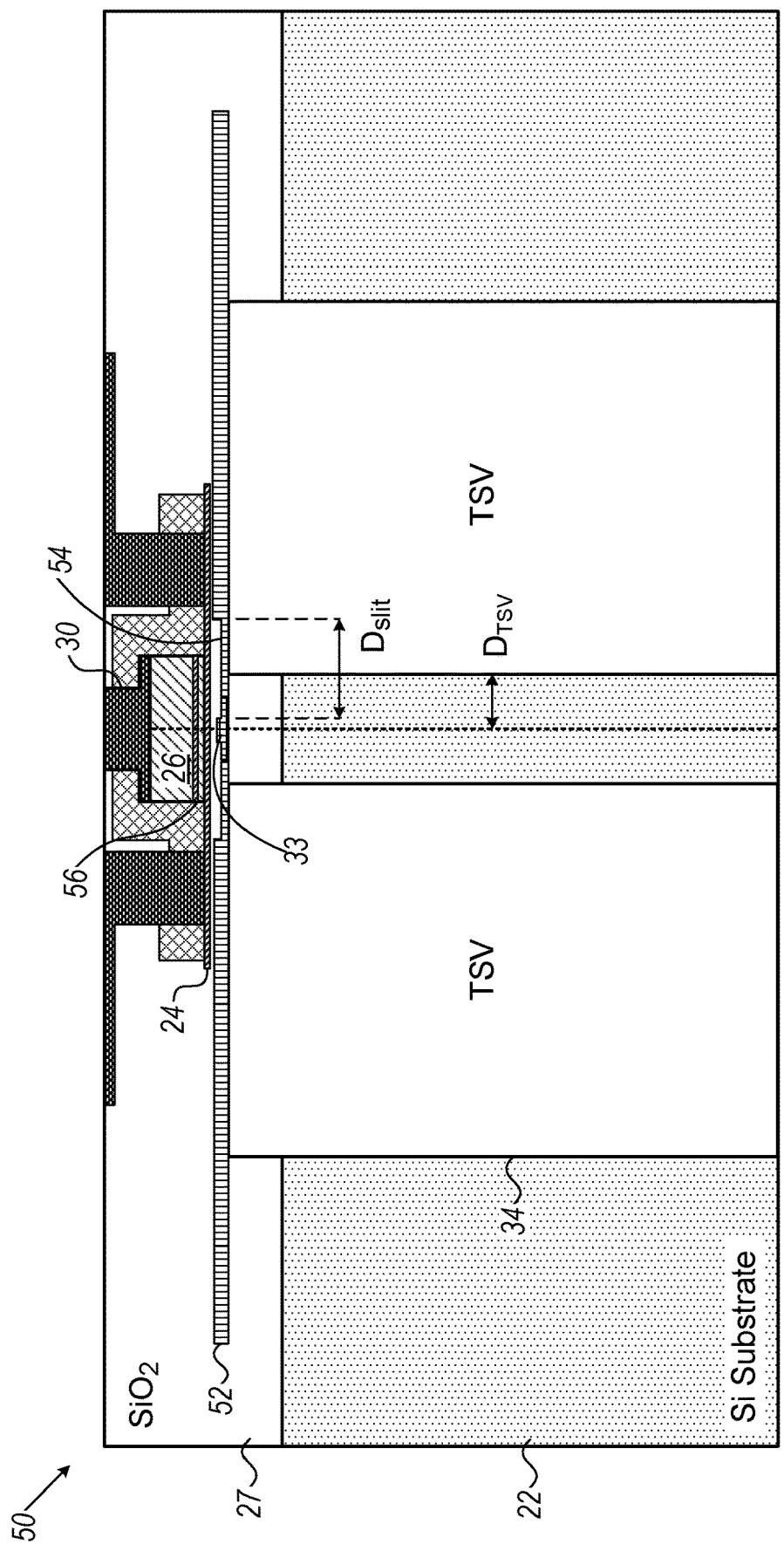
FIG. 2 is a schematic frontal sectional view of an optoelectronic device, in accordance with another embodiment of the invention.

FIG. 2 is a schematic frontal sectional view of an optoelectronic device 50, in accordance with another embodiment of the invention. Device 50 is configured as a hybrid laser, like device 20, and the principles of fabrication and operation of device 50 are similar to those described above. In device 50, however, a silicon waveguide layer 52 is configured as a double-slit waveguide, with slits 54 on opposing sides of central ridge waveguide 33. Waveguide 33 is in close proximity to a quantum well layer 56 in optical amplifier 26.

The double-slit configuration of the waveguide is advantageous in enhancing heat dissipation, without increasing optical losses (relative to the ridge waveguide alone) as long as slits 54 are sufficiently wide. For example, when the width of slits 54 ($D_{slit}$) is at least 2.75 µm, while the displacement of the inner edges of TSVs 34 from the centerline of ridge waveguide 33 ($D_{TSV}$) is at least 1.5 µm, the resulting optical losses will be similar to those in device 20, i.e., less than about 0.1 dB/cm.

Figure 3:
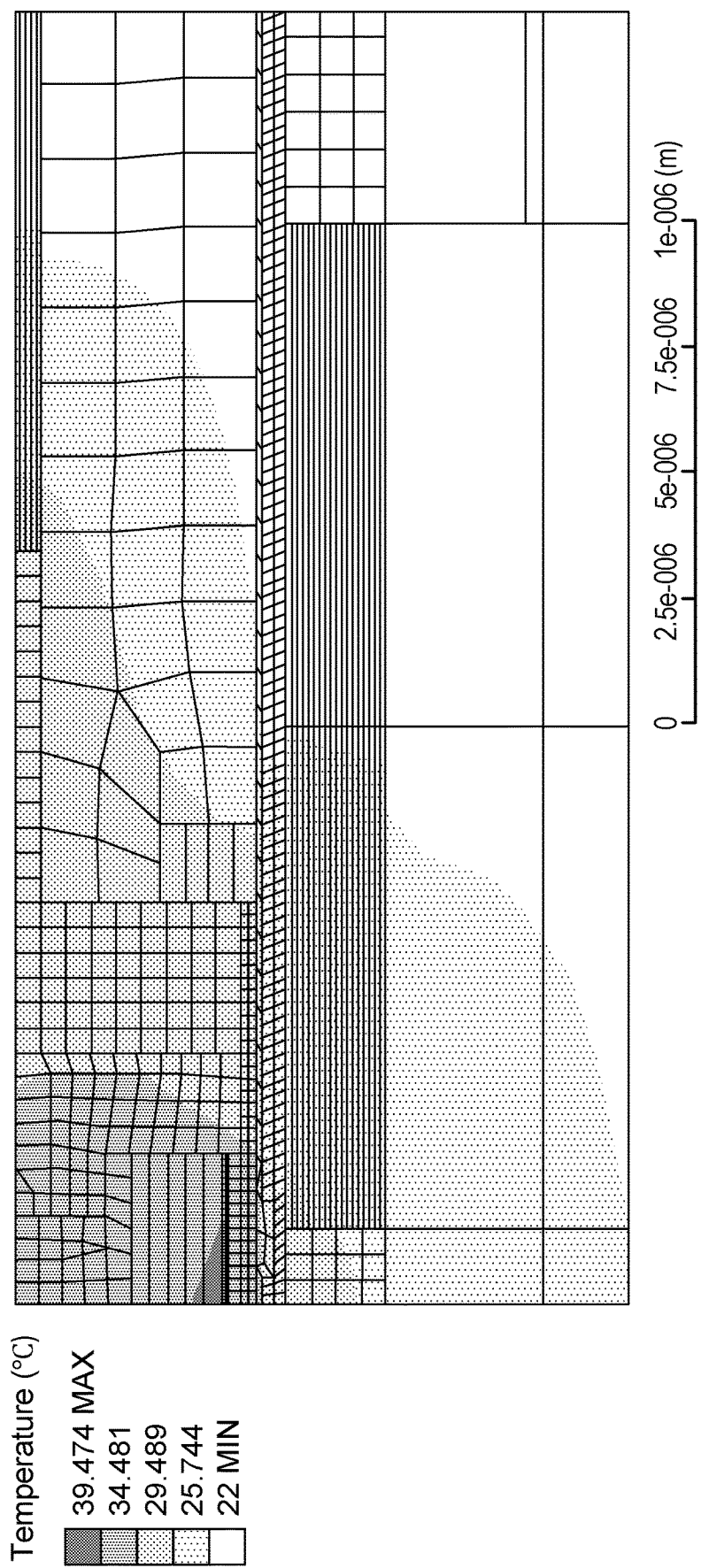
FIG. 3 is a plot showing temperature distribution in the device of FIG. 2 during laser operation, in accordance with an embodiment of the invention.

FIG. 3 is a plot showing temperature distribution as a function of location in device 50 during laser operation, in accordance with an embodiment of the invention. The vertical axis at the left side of the plot corresponds to the dashed centerline of device 50, as shown in FIG. 2, while the horizontal axis at the bottom of the plot corresponds to the lower edge of silicon substrate 22. The gray scale indicates the temperature at each location within the device, calculated by simulation of the heat flow, assuming device 50 to be operating at 20% efficiency with an optical output of 200 mW (and thus dissipating 800 mW of heat). The highest temperature is about 39.5° C., within quantum well layer 56.

By contrast, in the absence of TSVs 34, the maximum temperature was estimated to reach 85° C. when the device was driven at the same input power level. In view of the strong dependence of laser efficiency on temperature, it is estimated that the temperature reduction due to TSVs 34 will increase the efficiency of device more than tenfold at this power level.

In alternative embodiments (not shown in the figures), TSVs may be applied, as described above, in conjunction with other types of waveguides, and particularly silicon waveguides capable of being configured as p-i-n diodes. For example, such TSVs may be applied in conjunction with photonic crystal waveguides, free-standing strip waveguides (possibly with supporting ribs), or waveguides defined by sub-wavelength gratings. The present approaches to hybrid laser fabrication are also applicable using various other sorts of resonators, such as ring resonators or photonic crystal resonators.

Furthermore, biasing of the p-i-n diode structure in the waveguide layer can be used not only for removal of free carriers, as described above, but also for modulating the laser mode in hybrid optoelectronic devices and thus controlling certain operating parameters of such devices. For example, bias generator 44 can modulate the voltage applied between TSVs 34 (FIG. 1A) in order to vary the density of free carriers within waveguide 33, and thus control the coefficient of absorption and effective index of refraction of the waveguide. Both reverse and forward bias voltages can be used for this purpose, depending on operating conditions and application requirements. This sort of voltage modulation can be used, for example, to improve (or impede) mode coupling between optical amplifier 26 and waveguide 33 at a desired wavelength, and possibly to tune the wavelength of a hybrid laser. Additionally or alternatively, control of the carrier density by bias generator 44 can be used in setting and modulating the output power of the hybrid laser by varying the optical attenuation of the waveguide. All such alternative embodiments and applications are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a silicon substrate;
   a silicon waveguide layer disposed over the silicon substrate and comprising an optical waveguide;
   one or more through-silicon vias (TSVs), extending through the silicon substrate and contacting the silicon waveguide layer;
   a III-V base layer disposed over the silicon waveguide layer; and
   an optical amplifier disposed on the III-V base layer and optically coupled to the optical waveguide.

2. The device according to claim 1, wherein the one or more TSVs comprise first and second TSVs, which contact the silicon waveguide layer on opposing first and second sides of the optical waveguide.

3. The device according to claim 2, and comprising a bias generator, which is coupled to apply a bias voltage between the first and second TSVs.

4. The device according to claim 3, wherein the silicon waveguide layer comprises a p-doped region in contact with the first TSV and an n-doped region in contact with the second TSV, while the optical waveguide comprises intrinsic silicon, thereby defining a p-i-n diode structure in the silicon waveguide.

5. The device according to claim 4, wherein the bias generator is configured to reverse-bias the p-i-n diode structure, thereby sweeping free carriers out of the optical waveguide.

6. The device according to claim 3, wherein the bias generator is configured to modulate the bias voltage so as to control at least one operating parameter of the device, selected from a group of operating parameters consisting of a coefficient of absorption and an effective index of refraction of the optical waveguide.

7. The device according to claim 1, wherein the optical waveguide comprises a ridge on the silicon waveguide layer in proximity to the optical amplifier.

8. The device according to claim 1, wherein the optical waveguide comprises a double-slit waveguide.

9. The device according to claim 1, and comprising a dielectric layer between the silicon waveguide layer and the III-V substrate.

10. The device according to claim 9, and comprising a dielectric encapsulation structure, which encapsulates the optical amplifier and comprises the dielectric layer between the silicon waveguide layer and the III-V substrate.

11. The device according to claim 1, wherein the III-V base layer and the optical amplifier comprise InP.

12. The device according to claim 1, wherein the optical amplifier comprises multiple epitaxial layers formed on the III-V base layer.

13. A method for fabricating an optoelectronic device, comprising:
    forming an optical waveguide in a silicon waveguide layer disposed on a silicon substrate;
    forming one or more through-silicon vias (TSVs) in the silicon substrate so that the one or more TSVs extend through the silicon substrate and contact the silicon waveguide layer;
    bonding a III-V base layer to the silicon waveguide layer; and
    forming an optical amplifier on the III-V base layer so that the optical amplifier is optically coupled to the optical waveguide.

14. The method according to claim 13, wherein the one or more TSVs comprise first and second TSVs, which contact the silicon waveguide layer on opposing first and second sides of the optical waveguide.

15. The method according to claim 14, and comprising coupling a bias generator to apply a bias voltage between the first and second TSVs.

16. The method according to claim 15, wherein the silicon waveguide layer comprises a p-doped region in contact with the first TSV and an n-doped region in contact with the second TSV, while the optical waveguide comprises intrinsic silicon, thereby defining a p-i-n diode structure in the silicon waveguide.

17. The method according to claim 13, wherein forming the optical waveguide comprises a forming a ridge on the silicon waveguide layer in proximity to the optical amplifier.

18. The method according to claim 13, wherein forming the optical waveguide comprises forming slits in the silicon waveguide layer on opposing sides of the optical waveguide.

19. The method according to claim 13, and comprising encapsulating the optical amplifier in a dielectric layer between the silicon waveguide layer and the III-V substrate.

20. The method according to claim 13, wherein forming the optical amplifier comprises depositing multiple epitaxial layers on the III-V base layer.

* * * * *